(12) United States Patent
Sakai (10) Patent No.: US 8,716,782 B2
(45) Date of Patent: May 6, 2014

(54) POWER SEMICONDUCTOR DEVICE HAVING A THIN GATE INSULATING FILM WITH HIGH-K DIELECTRIC MATERIALS AND METHOD FOR MANUFACTURING THE SAME

(75) Inventor: Takayuki Sakai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/230,333

(22) Filed: Sep. 12, 2011

(65) Prior Publication Data

US 2012/0061749 A1    Mar. 15, 2012

(30) Foreign Application Priority Data

Sep. 13, 2010  (JP) ................................ 2010-204412

(51) Int. Cl.
*H01L 29/66* (2006.01)
*H01L 27/108* (2006.01)
*H01L 21/02* (2006.01)

(52) U.S. Cl.
USPC ........... 257/330; 257/135; 257/310; 257/328; 257/410

(58) Field of Classification Search
USPC ......... 257/135–136, 242, 310, 330, 328, 410; 438/591
See application file for complete search history.

(56) References Cited

U.S. PATENT DOCUMENTS

| | | | |
|---|---|---|---|
| 6,406,945 B1 | 6/2002 | Lee et al. | |
| 7,157,780 B2* | 1/2007 | Harada | ......................... 257/410 |
| 7,345,342 B2* | 3/2008 | Challa et al. ................. | 257/341 |
| 2004/0084736 A1* | 5/2004 | Harada | .......................... 257/410 |
| 2006/0054961 A1* | 3/2006 | Suzuki et al. | .................. 257/310 |
| 2006/0141695 A1* | 6/2006 | Choi et al. | ..................... 438/232 |
| 2007/0252195 A1* | 11/2007 | Yoshikawa et al. | ............ 257/329 |
| 2008/0102616 A1* | 5/2008 | Tsunashima et al. | ......... 438/591 |

(Continued)

FOREIGN PATENT DOCUMENTS

| | | |
|---|---|---|
| JP | 2002-289851 A | 10/2002 |
| JP | 2008-034794 A | 2/2008 |
| JP | 2008-227514 | 9/2008 |
| JP | 2008-306051 A | 12/2008 |

OTHER PUBLICATIONS

Hobbs, C. et al., "Fermi Level Pinning at the PolySi/Metal Oxide Interface", 2003 Symposium on VLSI Technology Digest of Technical Papers pp. 9-10.

Taiwanese Office Action; Application No. 100129057; Issued Nov. 30, 2013 (with English translation).

*Primary Examiner* — Long K Tran
*Assistant Examiner* — Dzung Tran
(74) *Attorney, Agent, or Firm* — Patterson & Sheridan, L.L.P.

(57) ABSTRACT

In general, according to one embodiment, a power semiconductor device includes a first semiconductor layer of a first conductivity type, a second semiconductor layer of a second conductivity type, a trench, a gate insulating film, and a gate electrode. The second semiconductor layer is provided on the first semiconductor layer. The trench is provided from the second semiconductor layer to the first semiconductor layer. The gate insulating film is composed of an oxide film and a protective layer formed on the oxide film. The protective layer is opposed to the second semiconductor layer across the oxide film in the trench. The oxide film covers the second semiconductor layer exposed at a sidewall of the trench and includes at least one of aluminum and yttrium. The gate electrode is made of n-type polysilicon buried in the trench in direct contact with the gate insulating film.

18 Claims, 7 Drawing Sheets

(56) References Cited

U.S. PATENT DOCUMENTS

| | | | |
|---|---|---|---|
| 2008/0211016 A1* | 9/2008 | Boden | 257/330 |
| 2008/0258271 A1* | 10/2008 | Lee et al. | 257/637 |
| 2008/0303099 A1 | 12/2008 | Iwamoto et al. | |
| 2009/0242953 A1* | 10/2009 | Booth et al. | 257/301 |
| 2010/0025759 A1 | 2/2010 | Yoshimochi | |
| 2011/0159678 A1* | 6/2011 | Hsu et al. | 438/587 |
| 2012/0018798 A1* | 1/2012 | Mauder et al. | 257/328 |

* cited by examiner

POWER SEMICONDUCTOR DEVICE HAVING A THIN GATE INSULATING FILM WITH HIGH-K DIELECTRIC MATERIALS AND METHOD FOR MANUFACTURING THE SAME

CROSS-REFERENCE TO RELATED APPLICATION

This application is based upon and claims the benefit of priority from the prior Japanese Patent Application No. 2010-204412, filed on Sep. 13, 2010; the entire contents of which are incorporated herein by reference.

FIELD

Embodiments described herein relate generally to a trench gate type power semiconductor device having a gate insulating film including a high dielectric film and a method for manufacturing the same.

BACKGROUND

Power MOSFETs (Metal Oxide Semiconductor Field Effect Transistors) are used as switching elements in e.g. portable terminal equipment such as mobile phones and mobile personal computers. In the power MOSFET, for lower power consumption, reduction of on-resistance of the channel layer is required. For instance, by thinning the gate insulating film, population inversion is enhanced to increase the carrier density of the channel layer. This is a conventional method for reducing the on-resistance of the channel layer. However, if the on-resistance reduction is enhanced by this method, the leakage current increases due to the tunnel current of the gate insulating film. Thus, to enhance population inversion even for a thick gate insulating film, it has been investigated to use a dielectric film with high dielectric constant for the gate insulating film.

DETAILED DESCRIPTION

In general, according to one embodiment, a power semiconductor device includes a semiconductor layer of a first conductivity type, a first semiconductor layer of the first conductivity type, a second semiconductor layer of a second conductivity type, a trench, a gate insulating film, a gate electrode, an interlayer insulating film, a third semiconductor layer of the first conductivity type, a first electrode, and a second electrode. The first semiconductor layer is provided on a first surface of the semiconductor layer and has a lower first conductivity type impurity concentration than the semiconductor layer. The second semiconductor layer is provided on the first semiconductor layer. The trench is provided from the second semiconductor layer to the first semiconductor layer. The gate insulating film is composed of an oxide film and a protective layer formed on the oxide film. The protective layer is opposed to the second semiconductor layer across the oxide film in the trench. The oxide film covers the second semiconductor layer exposed at a sidewall of the trench and includes at least one of aluminum and yttrium. The gate electrode is made of n-type polysilicon buried in the trench in direct contact with the gate insulating film. The gate electrode is opposed to the second semiconductor layer across the gate insulating film. The interlayer insulating film is provided on the gate electrode and insulates the gate electrode from outside of the trench. The third semiconductor layer is selectively formed in a surface of the second semiconductor layer. The third semiconductor layer is in contact with the gate insulating film at the sidewall of the trench. The third semiconductor layer has a higher first conductivity type impurity concentration than the first semiconductor layer. The first electrode is electrically connected to a second surface of the semiconductor layer on opposite side of the first surface. The second electrode is electrically connected to the third semiconductor layer and the second semiconductor layer.

Embodiments of the invention will now be described with reference to the drawings. The figures used in describing the embodiments are schematic for ease of description. In actual practice, the shape, dimension, and size relation of components in the figures are not necessarily identical to those shown in the figures, but can be suitably modified as long as the effect of the invention is achieved.

First Embodiment

Figure 1:
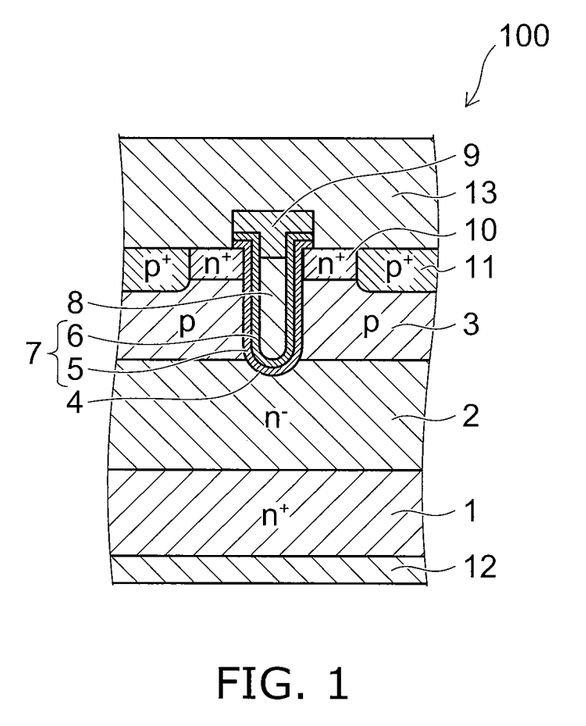
FIG. 1 is a main part sectional view of a semiconductor device according to a first embodiment.

The structure of a semiconductor device according to a first embodiment of the invention is described with reference to FIG. 1. FIG. 1 is a main part sectional view of the semiconductor device 100 according to the first embodiment. The semiconductor device 100 according to the first embodiment is a MOSFET of the trench gate type including an $n^+$-type drain layer 1 (semiconductor layer of a first conductivity type), an $n^-$-type drift layer 2 (first semiconductor layer of the first conductivity type), a p-type base layer 3 (second semiconductor layer of the second conductivity type), a gate insulating film 7, a gate electrode 8, an interlayer insulating film 9, an $n^+$-type source layer 10 (third semiconductor layer of the first conductivity type), a $p^+$-type contact layer 11, a drain electrode 12 (first electrode), and a source electrode 13 (second electrode). In this description, it is assumed that the semiconductor of the $n^+$-type drain layer 1, the $n^-$-type drift layer 2, the p-type base layer 3, the $n^+$-type source layer 10, and the $p^+$-type contact layer 11 is made of silicon.

The semiconductor device 100 is configured as follows. On a first surface of the $n^+$-type drain layer 1, an $n^-$-type drift layer 2 having a lower n-type impurity concentration than the $n^+$-type drain layer 1 is formed. Furthermore, a p-type base layer 3 is formed at the surface of the $n^-$-type drift layer 2. A trench 4 is formed so as to penetrate through the p-type base layer 3 to the inside of the $n^-$-type drift layer 2. In this trench 4, an $Al_2O_3$ (alumina) film 5 is formed as an oxide film so as to cover the side surface of the p-type base layer 3 exposed at the sidewall of the trench 4 and the surface of the $n^-$-type drift layer 2 exposed at the bottom of the trench 4. That is, the Al$_2$O$_3$ film 5 is formed so as to cover the side surface and bottom surface of the trench 4. Furthermore, a silicon oxide film (SiO$_2$) 6 is formed as a protective layer so as to cover the Al$_2$O$_3$ film 5 along the side surface and bottom surface of the trench 4. The Al$_2$O$_3$ film 5 of the oxide film and the silicon oxide film 6 of the protective layer constitute a gate insulating film 7. Here, the Al$_2$O$_3$ film 5 may be a polycrystal or single crystal.

The gate electrode 8 made of n-type polysilicon is formed by being buried in the trench 4 in contact with the gate insulating film 7. Thus, the gate electrode 8 is insulated from the n$^-$-type drift layer 2 and the p-type base layer 3. That is, the gate electrode 8 is opposed to the p-type base layer 3 across the Al$_2$O$_3$ film 5 and the silicon oxide film 6 as a protective layer, and spaced from the Al$_2$O$_3$ film 5 by the silicon oxide film 6. When a voltage exceeding the threshold is applied to the gate electrode 8, a channel layer as a population inversion layer is formed in the portion of the p-type base layer 3 opposed to the gate electrode 8.

The interlayer insulating film 9 is formed above the gate electrode 8. The gate electrode 8 is enclosed with the interlayer insulating film 9 and the gate insulating film 7 and insulated from outside. Furthermore, in a region not shown, the gate electrode 8 is extracted outside by a gate wiring layer, not shown, via an opening of the interlayer insulating film 9.

The n$^+$-type source layer 10 has a higher n-type impurity concentration than the n$^-$-type drift layer 2. The n$^+$-type source layer 10 is selectively formed in the surface of the p-type base layer 3 so as to be in contact with the Al$_2$O$_3$ film 5 formed on the side surface of the trench 4. Thus, the gate electrode 8 is opposed to the n$^+$-type source layer 10, the p-type base layer 3, and the n$^-$-type drift layer 2 across the gate insulating film 7. The aforementioned channel layer is formed in the p-type base layer 3 so as to connect the n$^+$-type source layer 10 and the n$^-$-type drift layer 2. Furthermore, the p$^+$-type contact layer 11 has a higher p-type impurity concentration than the p-type base layer 3. The p$^+$-type contact layer 11 is selectively formed in the surface of the p-type base layer 3 so as to be connected to the n$^+$-type source layer 10. The p$^+$-type contact layer 11 is electrically connected to the p-type base layer 3.

The drain electrode 12 is formed in ohmic contact with the second surface of the n$^+$-type drain layer 1 on the opposite side of the first surface. The source electrode 13 is located on the n$^+$-type source layer 10, the p$^+$-type contact layer 11, and the interlayer insulating film 9. The source electrode 13 is insulated from the gate electrode 8 by the interlayer insulating film 9. The source electrode 13 is formed in ohmic contact with the n$^+$-type source layer 10 and the p$^+$-type contact layer 11. The source electrode 13 is electrically connected to the p-type base layer 3 via the p$^+$-type contact layer 11.

Figure 2A:
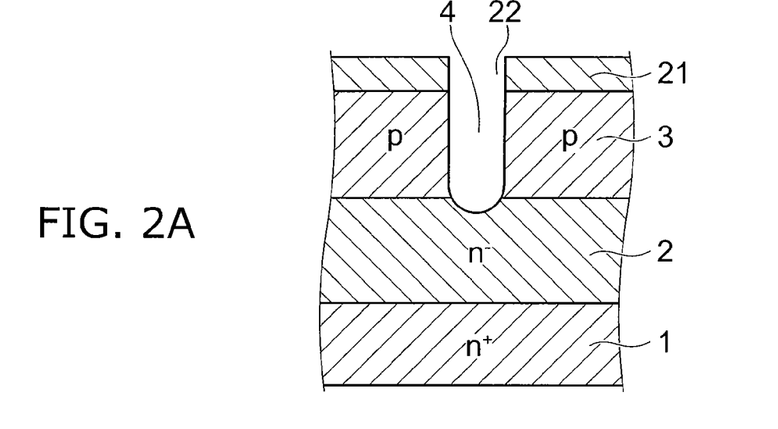
FIGS. 2A to 2C are main part sectional views showing part of the process for manufacturing the semiconductor device according to the first embodiment.
Figure 2B:
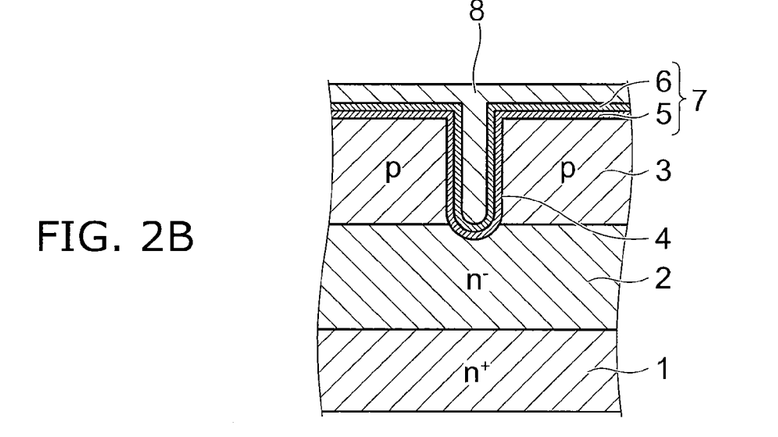
Figure 2C:
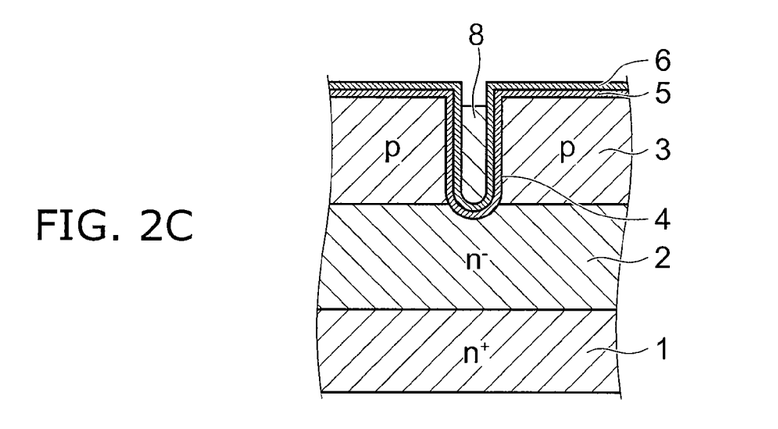
Figure 3:
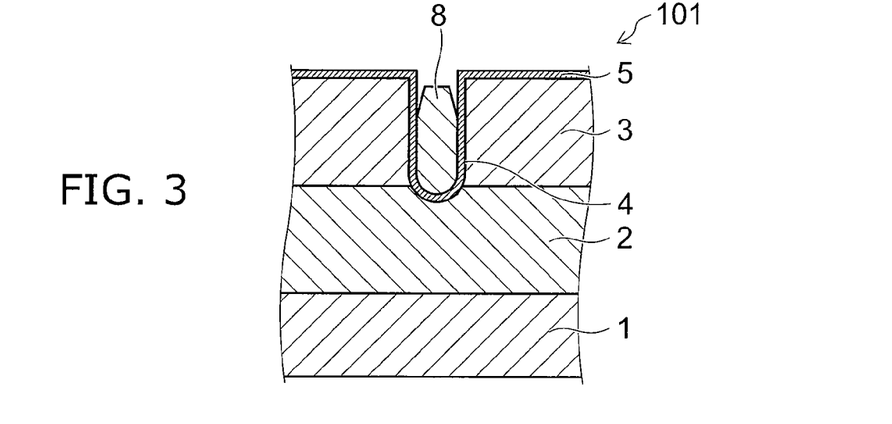
FIG. 3 is a main part sectional view showing part of a process for manufacturing a semiconductor device of a comparative example.
Figure 4:
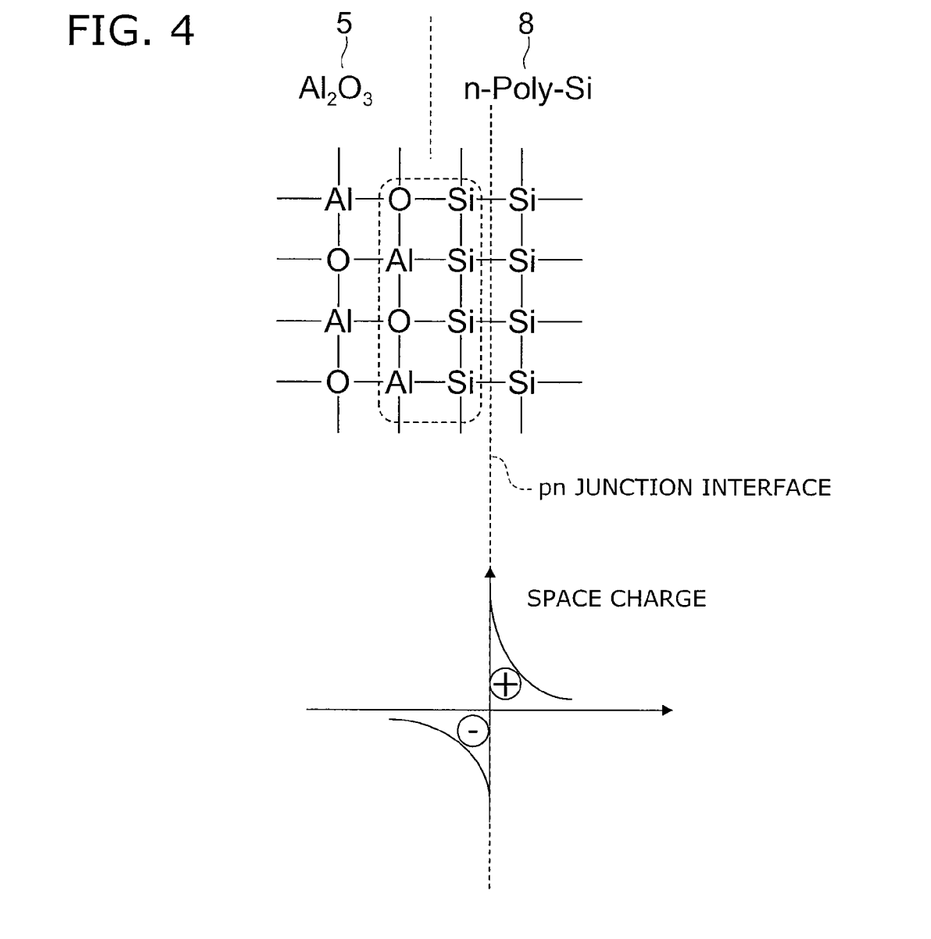
FIG. 4 is a schematic diagram of atomic arrangement at a junction between n-type polysilicon of a gate electrode and an $Al_2O_3$ film.

Next, a process for manufacturing the semiconductor device 100 according to this embodiment is described with reference to FIGS. 2A to 2C. Furthermore, the effect of the semiconductor device and the method for manufacturing a semiconductor device according to this embodiment is described with reference to FIGS. 3 and 4 in comparison with a comparative example. FIGS. 2A to 2C are main part sectional views showing part of the process for manufacturing the semiconductor device 100 according to this embodiment. FIG. 3 is a main part sectional view showing part of a process for manufacturing a semiconductor device 101 of the comparative example. FIG. 4 is a schematic diagram of atomic arrangement at the junction between n-type polysilicon of the gate electrode 8 and the Al$_2$O$_3$ film 5.

As shown in FIG. 2A, an n$^-$-type drift layer 2 is formed by epitaxial growth on the first surface of the n$^+$-type silicon substrate 1 constituting an n$^+$-type drain layer 1. The n$^-$-type drift layer 2 is formed with a lower n-type impurity concentration than the n$^+$-type drain layer 1. As described later, the surface of the n$^+$-type silicon substrate 1 on the opposite side of the first surface will be polished later. Thus, the n$^+$-type drain layer 1 will be formed so as to have this first surface and a second surface opposed thereto, and to have a prescribed thickness. A p-type base layer 3 is formed on the n$^-$-type drift layer 2 by ion implantation of p-type impurity such as boron (B) into the surface of the n$^-$-type drift layer 2 followed by heat treatment. On the surface of the p-type base layer 3, an SiO$_2$ mask 21 having an opening 22 is formed by RIE (Reactive Ion Etching) using a resist mask, not shown. By using anisotropic etching such as RIE, a trench 4 is formed immediately below the opening 22 of the SiO$_2$ mask 21. The trench 4 penetrates through the p-type base layer 3 to the inside of the n$^-$-type drift layer 2, which is exposed into the trench 4. As an example, the trench 4 can be shaped like a stripe extending perpendicular to the page. However, the trench 4 is not limited thereto, but may be in a lattice or staggered configuration extending perpendicular to the page. After forming the trench 4, the SiO$_2$ 21 is removed.

Subsequently, as shown in FIG. 2B, an Al$_2$O$_3$ film 5 is formed by vapor phase deposition such as ALD (Atomic Layer Deposition), CVD (Chemical Vapor Deposition), or sputtering. The Al$_2$O$_3$ film 5 is formed so as to cover the surface of the p-type base layer 3, the side surface of the p-type base layer 3 exposed at the sidewall of the trench 4, and the n$^-$-type drift layer 2 exposed at the trench bottom. Furthermore, by e.g. the CVD method, a silicon oxide film 6 is formed as a protective layer so as to cover the entire surface of the Al$_2$O$_3$ film 5. The protective layer made of the silicon oxide film 6 and the oxide film made of the Al$_2$O$_3$ film 5 constitute a gate insulating film 7. An n-type polysilicon 8 is formed on the entire surface of the p-type base layer 3 so as to fill the trench 4 in contact with the gate insulating film 7.

Next, as shown in FIG. 2C, by CDE (Chemical Dry Etching), the n-type polysilicon 8 is removed from the entire surface of the p-type base layer 3, and only the portion buried inside the trench 4 is left. The gate electrode 8 is insulated from the n$^-$-type drift layer 2 and the p-type base layer 3 by the gate insulating film 7. The gate electrode 8 is in direct contact with the silicon oxide film 6 as a protective layer, and spaced from the Al$_2$O$_3$ film 5 by the silicon oxide film 6. The gate electrode 8 is opposed to the p-type base layer across the Al$_2$O$_3$ film 5 and the silicon oxide film 6 as a protective layer.

Subsequently, although the detailed description is omitted, the semiconductor device 100 is formed as follows by the conventional process. An interlayer insulating film 9 made of a silicon oxide film is formed by e.g. CVD on the gate electrode 8 and the silicon oxide film 6 of the protective layer. The interlayer insulating film 9 and the gate insulating film 7, except the region of the trench 4, are etched away using a resist mask, not shown. Thus, the gate electrode 8 is enclosed with the interlayer insulating film 9 and the gate insulating film 7 and insulated from outside. Furthermore, in a region not shown, the gate electrode 8 is extracted outside by a gate wiring layer, not shown, via an opening of the interlayer insulating film 9.

Next, from the surface of the p-type base layer 3, n-type impurity such as arsenic (As) or phosphorus (P) is ion implanted and heat treated. Thus, an n$^+$-type source layer 10 having a higher n-type impurity concentration than the n$^-$-type drift layer 2 is formed in the surface of the p-type base layer 3 so as to be in contact with the Al$_2$O$_3$ film 5 formed on the side surface of the trench 4. Accordingly, the gate electrode 8 is opposed to the n$^+$-type source layer 10, the p-type base layer 3, and the n⁻-type drift layer 2 across the gate insulating film 7. Furthermore, by using a resist mask, not shown, p-type impurity such as boron (B) is selectively ion implanted and heat treated in the surface of the p-type base layer 3 where the n⁺-type source layer 10 has been formed. Thus, a p⁺-type contact layer 11 having a higher p-type impurity concentration than the p-type base layer 3 is selectively formed in the surface of the p-type base layer 3 so as to be connected to the n⁺-type source layer 10 and the p-type base layer 3 and spaced from the gate insulating film 7.

Next, the surface of the n⁺-type silicon substrate 1 on the opposite side of the first surface is polished. Thus, the n⁺-type drain layer 1 is formed to have a prescribed thickness. Then, a drain electrode 12 is formed in ohmic contact with the second surface of the n⁺-type drain layer 1 on the opposite side of the first surface. The source electrode 13 is formed on the n⁺-type source layer 10, the p⁺-type contact layer 11, and the interlayer insulating film 9. The source electrode 13 is insulated from the gate electrode 8 by the interlayer insulating film 9. The source electrode 13 is formed in ohmic contact with the n⁺-type source layer 10 and the p⁺-type contact layer 11. The source electrode 13 is electrically connected to the p-type base layer 3 via the p⁺-type contact layer 11. Thus, the semiconductor device 100 shown in FIG. 1 is formed.

In the semiconductor device 100 according to this embodiment, the gate insulating film 7 is composed of the $Al_2O_3$ film 5 and the silicon oxide film 6. The $Al_2O_3$ film 5 covers the side surface of the p-type base layer 3 exposed at the sidewall of the trench 4, which penetrates through the p-type base layer 3 to the inside of the n⁻-type drift layer 2. The silicon oxide film 6 is formed on this $Al_2O_3$ film 5 and opposed to the p-type base layer 3 in the trench. In direct contact with this gate insulating film 7, the gate electrode 8 of n-type polysilicon is buried in the trench 4 and opposed to the p-type base layer 3. Because of the structure as described above, the semiconductor device 100 has the following effect.

FIG. 3 is a main part sectional view of part of a process for manufacturing a semiconductor device 101 of the comparative example. The gate insulating film does not have a protective layer made of a silicon oxide film 6, but consists only of an $Al_2O_3$ film 5. The semiconductor device 101 of the comparative example has the same structure as the semiconductor device 100 according to this embodiment except the difference in the structure of the gate insulating film 7. The part of the manufacturing process shown in FIG. 3 corresponds to FIG. 2C showing part of the process for manufacturing the semiconductor device 100 according to this embodiment. The semiconductor device 101 of the comparative example is subjected to a process similar to the manufacturing process of FIGS. 2A and 2B. Thus, as shown in FIG. 3, the gate insulating film consists only of the $Al_2O_3$ film 5. This $Al_2O_3$ film 5 covers the side surface of the p-type base layer 3 exposed at the sidewall of the trench, which penetrates through the p-type base layer 3 to the inside of the n⁻-type drift layer 2.

In direct contact with the oxide film 5 made of this $Al_2O_3$ film 5, the gate electrode 8 made of n-type polysilicon is buried in the trench 4 and formed entirely on the p-type base layer. Subsequently, by the aforementioned CDE, n-type polysilicon on the surface of the p-type base layer 3 is etched away so that the gate electrode 8 is left in the trench 4. In the semiconductor device 101 of the comparative example, as shown in FIG. 3, in this CDE etching, the etching rate of the gate electrode increases at the interface between the gate electrode 8 of n-type polysilicon and the gate insulating film made of the $Al_2O_3$ film 5. As a result, the gate electrode 8 of the semiconductor device 101 on the trench opening side is not made flat. This causes malfunctions of the semiconductor device 101. In contrast, in the semiconductor device 100 according to this embodiment, as shown in FIG. 2C, the increase in the etching rate of the gate electrode is suppressed at the interface between the gate insulating film 7 and the gate electrode 8. Hence, as compared with the semiconductor device 101 of the comparative example, the gate electrode of n-type polysilicon is made flat. Thus, the semiconductor device 100 has good operating characteristics.

FIG. 4 schematically shows the neighborhood of the junction interface between the polysilicon gate electrode and the $Al_2O_3$ film 5. In the semiconductor device 101 of the comparative example, aluminum (Al) atoms and oxygen (O) atoms both exist at the uppermost surface of the $Al_2O_3$ film 5. This uppermost surface is in contact with the gate electrode 8 made of n-type polysilicon. Hence, at the interface therebetween, substitution of aluminum and silicon (Si) atoms occurs. Thus, it is considered that the region of the n-type polysilicon of the gate electrode 8 in contact with the $Al_2O_3$ film 5 is turned into p-type polysilicon. As a result, a p-n junction interface of n-type polysilicon and p-type polysilicon is presumably formed as shown in FIG. 4 near the interface between the gate electrode 8 and the $Al_2O_3$ film 5. By the formation of this p-n junction interface, electrons migrate from the n-type polysilicon to the p-type polysilicon. Thus, electrons become excessive in the p-type polysilicon. It is considered that due to these excess electrons, the etching rate of polysilicon by CDE increases at the interface between the gate electrode 8 and the gate insulating film 7 consisting of the oxide film 5 made of the $Al_2O_3$ film 5.

In contrast, in the semiconductor device 100 according to this embodiment, the gate insulating film 7 is composed of the oxide film 5 made of $Al_2O_3$ and the silicon oxide film 6. The $Al_2O_3$ film 5 covers the side surface of the p-type base layer exposed at the sidewall of the trench, which penetrates through the p-type base layer 3 to the inside of the n⁻-type drift layer 2. The silicon oxide film 6 is formed on this oxide film 5 made of $Al_2O_3$ and opposed to the p-type base layer 3 in the trench. In direct contact with this gate insulating film 7, the gate electrode 8 of n-type polysilicon is buried in the trench 4 and opposed to the p-type base layer 3. That is, on the sidewall of the trench 4, the n-type polysilicon gate electrode 8 is opposed to the p-type base layer 3 without direct contact with the $Al_2O_3$ film 5 because of the protective layer 6 made of the silicon oxide film 6. Hence, because of the silicon oxide film 6, the silicon atom of the gate electrode 8 is not directly coupled to the aluminum atom of the oxide film 5. Accordingly, the protective layer 6 prevents substitution of silicon and aluminum atoms between the $Al_2O_3$ film 5 and the n-type polysilicon gate electrode 8. Thus, when the n-type polysilicon gate electrode 8 is etched by CDE as in the comparative example of FIG. 3, increase in the etching rate of polysilicon by CDE is suppressed at the interface between the n-type polysilicon gate electrode 8 and the gate insulating film 7. Hence, even if the $Al_2O_3$ film 5 with high dielectric constant is used for the gate insulating film of the trench gate structure, the semiconductor device 100 according to this embodiment has a flat polysilicon gate electrode and achieves good operating characteristics with low on-resistance.

This embodiment has been described in the case where the oxide film 5 is a high dielectric film made of $Al_2O_3$. The n-type polysilicon gate electrode 8 is brought into contact with the oxide film constituting the gate insulating film 7. At this interface, substitution of metallic atoms constituting the oxide film and silicon atoms constituting the gate electrode occurs and increases the etching rate of polysilicon at the interface. However, besides oxides containing aluminum atoms, this phenomenon has also been observed for e.g. oxides containing yttrium atoms. More specifically, like aluminum atoms, it is considered that yttrium atoms substitute for silicon atoms. In this embodiment, instead of using $Al_2O_3$ for the oxide film, it is also possible to use e.g. $Y_2O_3$ (yttria) and $HfY_xO_y$ (mixture of hafnia and yttria) containing yttrium. Furthermore, as other Al-containing oxides, it is also possible to use e.g. $HfAl_xO_y$ (hafnium aluminate). That is, by using an oxide film containing aluminum or yttrium as the oxide film 5, the same effect as that of the semiconductor device 100 according to this embodiment can be achieved. These all have higher dielectric constants than silicon oxide films used for conventional gate insulating films. Hence, this embodiment can provide a semiconductor device of the trench gate type with low on-resistance.

This embodiment has been described with reference to an example in which the silicon oxide film 6 is used as a protective layer between the oxide film of the gate insulating film 7 and the polysilicon gate electrode 8. However, other protective layers can also be used as long as they prevent substitution of metallic atoms in the oxide film 5 of the gate insulating film 7 and silicon atoms of the polysilicon gate electrode 8. As a protective layer, it is also possible to use e.g. a silicon nitride film or silicon oxynitride film.

Second Embodiment

Figure 5:
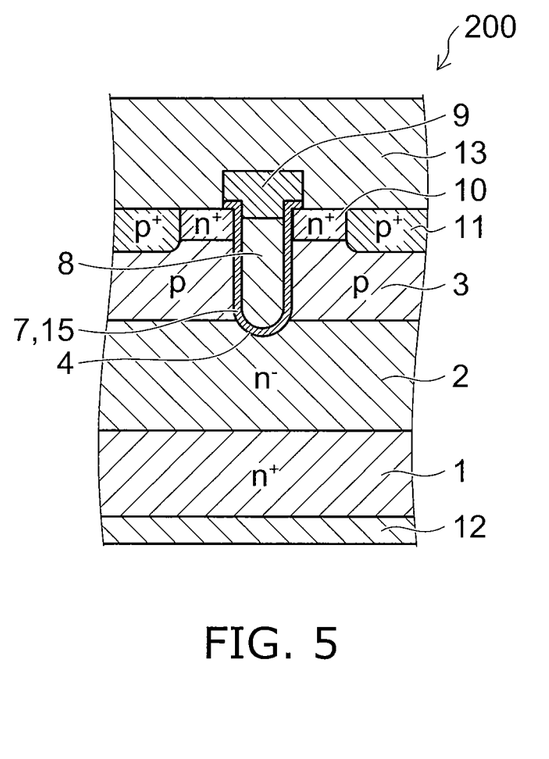
FIG. 5 is a main part sectional view of a semiconductor device according to a second embodiment.
Figure 6:
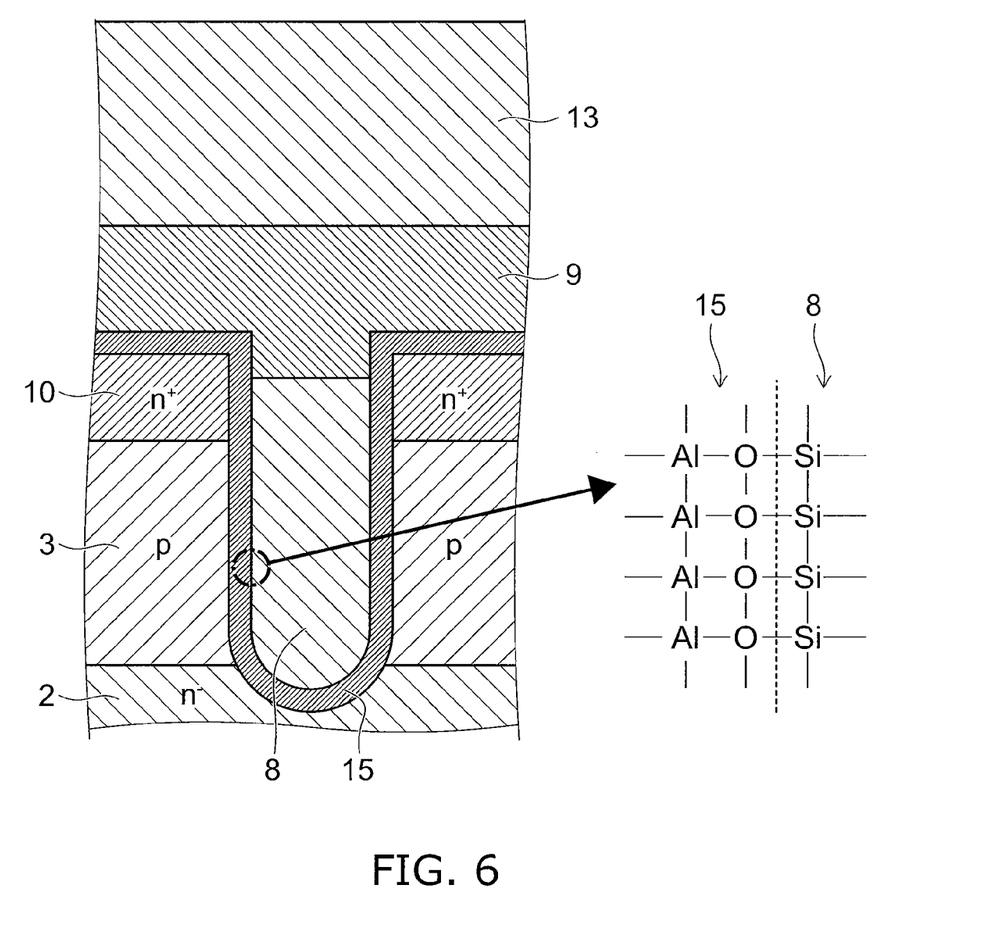
FIG. 6 is an enlarged view of a trench portion of FIG. 5.

A semiconductor device 200 according to a second embodiment of the invention is described with reference to FIGS. 5 and 6. FIG. 5 is a main part sectional view of the semiconductor device 200 according to this embodiment. FIG. 6 is an enlarged view of the trench portion of FIG. 5. The portions having the same configuration as those described in the first embodiment are labeled with like reference numerals or symbols, and the description thereof is omitted. Differences from the first embodiment are primarily described.

As shown in FIG. 5, the semiconductor device 200 according to this embodiment is different from the semiconductor device 100 according to the first embodiment in that the gate insulating film 7 is formed only from an $Al_2O_3$ film 15. In the semiconductor device 200 of this embodiment, the $Al_2O_3$ film 15 of the gate insulating film is a hexagonal single crystal. Its C-axis is oriented in the direction perpendicular to the side surface of the p-type base layer 3 exposed at the sidewall of the trench 4. FIG. 6 shows an enlarged view of the junction of the $Al_2O_3$ film 15 and the n-type polysilicon gate electrode 8 formed on the side surface of the p-type base layer 3 exposed at the sidewall of the trench 4.

As shown in FIG. 6, in the semiconductor device 200 according to this embodiment, the $Al_2O_3$ film 15 is made of single crystal and formed so as to cover the side surface of the p-type base layer 3 exposed at the sidewall of the trench 4. Among the crystal axes of the single crystal $Al_2O_3$ film 15, the C-axis is oriented in the direction perpendicular to the side surface of the p-type base layer exposed at the sidewall of the trench 4. The single crystal of this $Al_2O_3$ film 15 is arranged parallel to the side surface of the p-type base layer exposed at the sidewall of the trench 4. The single crystal is composed of aluminum atom layers and oxygen atom layers alternately and repeatedly stacked in the direction perpendicular to the side surface of the p-type base layer. The uppermost layer is formed from an oxygen atom layer. Such an $Al_2O_3$ film 15 can be realized by appropriately selecting the crystal growth condition.

The crystal growth method can be realized by e.g. the MOCVD (Metal Organic Chemical Vapor Deposition) or ALD (Atomic Layer Deposition) method. In particular, in the ALD method, TMA (trimethylaluminum) serving as an aluminum raw material is supplied for a given period of time to the side surface of the p-type base layer exposed at the sidewall of the trench 4. Thus, one atomic layer of aluminum atoms is formed, and the growth is stopped. Next, the supply of TMA is stopped. Then, an oxygen raw material such as water ($H_2O$), heavy water ($D_2O$), or ozone ($O_3$) is supplied for a given period of time to the side surface of the p-type base layer. Thus, one atomic layer of oxygen atoms is formed, and the growth is stopped. This is alternately repeated for crystal growth of the $Al_2O_3$ film 15. Accordingly, aluminum atom layers and oxygen atom layers are alternately repeated in the stacking direction as described above. Thus, the crystal of the $Al_2O_3$ film 15 with the C-axis oriented in the direction perpendicular to the side surface of the p-type base layer 3 is obtained. The crystal growth is finished up with only the supply of the oxygen raw material. Thus, the uppermost surface of the $Al_2O_3$ film 15 is terminated with an oxygen atom layer.

Besides the ALD method, it is also possible to use other vapor phase deposition methods such as the MOCVD or PECVD (Plasma-Enhanced Chemical Vapor Deposition) method. Also in these methods, the $Al_2O_3$ film 15 can be crystal grown under the crystal growth condition such that the $Al_2O_3$ film 15 is oriented along the C-axis. Thus, the $Al_2O_3$ crystal with the C-axis oriented in the direction perpendicular to the side surface of the p-type base layer 3 as described above is obtained. Here, the aforementioned raw materials of aluminum and oxygen are illustrative only. It is understood that other raw materials can also be used.

In the semiconductor device 200 according to this embodiment, the gate insulating film 7 consists only of the $Al_2O_3$ crystal with the C-axis oriented in the direction perpendicular to the side surface of the p-type base layer 3 exposed at the sidewall of the trench 4. However, this gate insulating film 7 consisting of the $Al_2O_3$ film 15 has a crystal structure in which the uppermost surface is entirely covered with an oxygen atom layer. Hence, the gate insulating film 7 can be regarded as being composed of the $Al_2O_3$ film and a protective layer made of the oxygen atom layer covering its uppermost surface. In this point, the semiconductor device according to this embodiment is different from the semiconductor device 101 of the comparative example in which the gate insulating film 7 similarly consists only of the $Al_2O_3$ film 5. This is because in the semiconductor device 101, the crystal of the $Al_2O_3$ film 5 is not necessarily an $Al_2O_3$ crystal with the C-axis oriented in the direction perpendicular to the side surface of the p-type base layer 3. Thus, at its uppermost surface, aluminum atoms and oxygen atoms can both exist. The semiconductor device 200 according to this embodiment is different from the semiconductor device 101 of the comparative example in that the uppermost surface consists of an oxygen atom layer free from Al atoms.

Thus, also in the semiconductor device 200 according to this embodiment, the gate insulating film 7 is composed of the oxide film 15 and the protective layer. The oxide film 15 is an $Al_2O_3$ film 15. The oxide film 15 covers the side surface of the p-type base layer 3 exposed at the sidewall of the trench, which penetrates through the p-type base layer 3 to the inside of the $n^-$-type drift layer 2. The protective layer is made of an oxygen atom layer formed on this oxide film 15 and opposed to the p-type base layer 3 in the trench. In direct contact with this gate insulating film 7, the gate electrode 8 of n-type polysilicon is buried in the trench 4 and opposed to the p-type base layer 3. That is, on the sidewall of the trench 4, the n-type polysilicon gate electrode 8 is opposed to the p-type base layer 3 without direct contact with the $Al_2O_3$ film 15 because of the protective layer made of the oxygen atom layer. Hence, because of the oxygen atom layer, the silicon atom of the gate electrode 8 is not directly coupled to the aluminum atom of the $Al_2O_3$ film. Accordingly, the protective layer prevents substitution of silicon and aluminum atoms between the $Al_2O_3$ film 15 and the n-type polysilicon gate electrode 8. Thus, when the n-type polysilicon gate electrode 8 is etched by CDE, increase in the etching rate of polysilicon by CDE occurring in the comparative example of FIG. 3 is suppressed at the interface between the n-type polysilicon gate electrode 8 and the gate insulating film 7. Hence, even if the $Al_2O_3$ film 15 with high dielectric constant is used for the gate insulating film of the trench gate structure, the semiconductor device 200 according to this embodiment has a flat polysilicon gate electrode and achieves good operating characteristics with low on-resistance as compared with the semiconductor device 101 of the comparative example.

The semiconductor device 200 according to this embodiment has the same structure as the semiconductor device 100 according to the first embodiment except the aforementioned difference in the structure and the manufacturing method of the gate insulating film 7. Thus, the semiconductor device 200 can be based on the same manufacturing method. Hence, the description of the manufacturing method is omitted. In the semiconductor device 200 according to this embodiment, the gate insulating film 7 is composed of the oxide film 15 and the protective layer. The oxide film 15 is an $Al_2O_3$ film 15 covering the side surface of the p-type base layer 3 exposed at the sidewall of the trench 4, which penetrates through the p-type base layer 3 to the inside of the n⁻-type drift layer 2. The protective layer is made of an oxygen atom layer formed on this oxide film 15 and opposed to the p-type base layer 3 in the trench 4. The oxygen atom layer of this protective layer may be replaced by a nitrogen atom layer. Such a structure also achieves the same effect as the semiconductor device 200 according to this embodiment. For instance, at the end of the crystal growth by the ALD method, after forming the aluminum atom layer, the supply of an oxygen raw material such as water ($H_2O$) can be replaced by the supply of a nitrogen raw material such as ammonia ($NH_3$). Thus, the last atom layer can be formed from a nitrogen atom layer.

Third Embodiment

Figure 7:
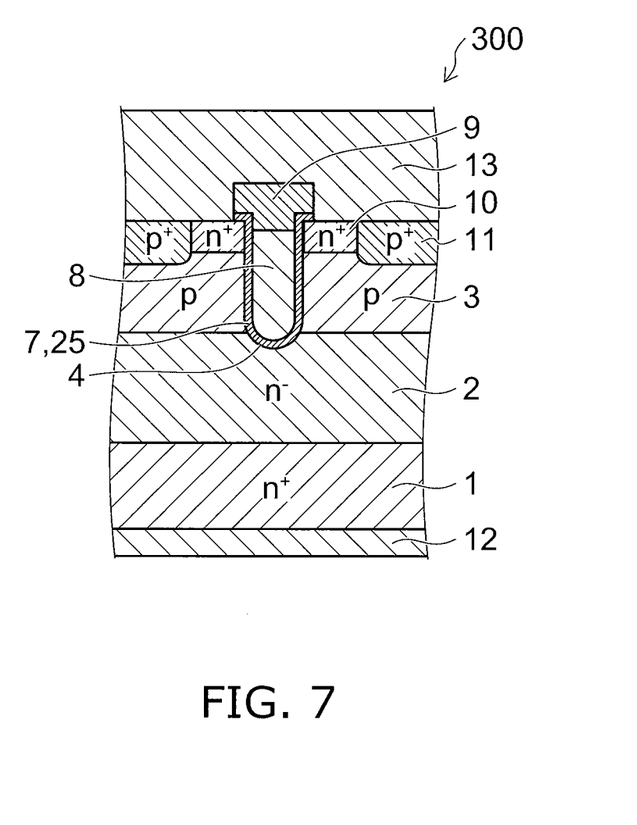
FIG. 7 is a main part sectional view of a semiconductor device according to a third embodiment.
Figure 8:
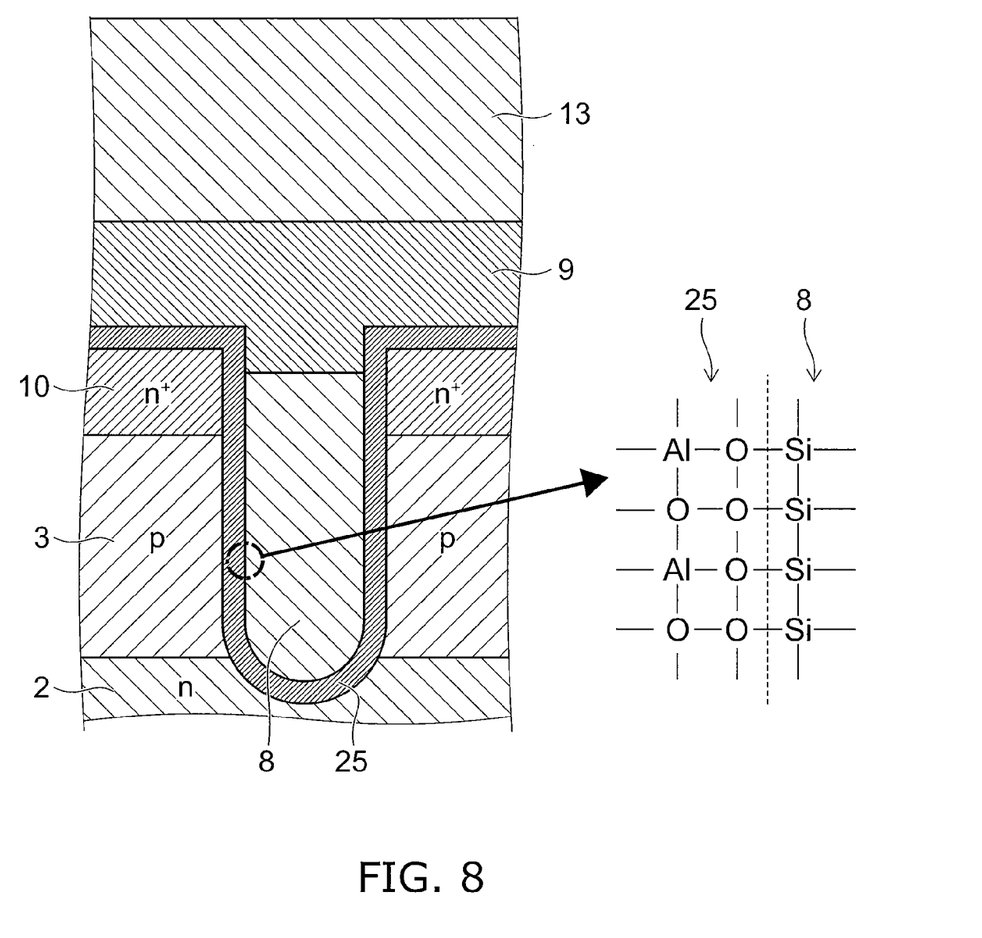
FIG. 8 is an enlarged view of a trench portion of FIG. 7.

A semiconductor device according to a third embodiment of the invention is described with reference to FIGS. 7 and 8. FIG. 7 is a main part sectional view of the semiconductor device 300 according to this embodiment. FIG. 8 is an enlarged view of the trench portion of FIG. 7. The portions having the same configuration as those described in the second embodiment are labeled with like reference numerals or symbols, and the description thereof is omitted. Differences from the second embodiment are primarily described.

As shown in FIG. 7, the semiconductor device 300 according to this embodiment is similar to the semiconductor device 200 according to the second embodiment in that the gate insulating film 7 is formed only from an $Al_2O_3$ film 25. However, the semiconductor device 300 according to this embodiment is different from the semiconductor device 200 according to the second embodiment in the following point. FIG. 8 schematically shows the neighborhood of the junction interface between the $Al_2O_3$ film 25 of the gate insulating film 7 and the gate electrode 8 of n-type polysilicon. As shown in FIG. 8, the crystal of the $Al_2O_3$ film 25 constituting the gate insulating film 7 is not a single crystal of $Al_2O_3$ with the C-axis oriented in the direction perpendicular to the side surface of the p-type base layer 3. That is, in the semiconductor device 300 according to this embodiment of the invention, the $Al_2O_3$ film 25 of the gate insulating film 7 may be a single crystal or polycrystal. In the case where the $Al_2O_3$ film 25 is a single crystal, its C-axis is not oriented in the direction perpendicular to the side surface of the p-type base layer 3 exposed at the sidewall of the trench 4.

As shown in FIG. 8, in general, by crystal growth under an arbitrary condition, the $Al_2O_3$ film 25 is formed on the side surface of the p-type base layer 3 exposed at the sidewall of the trench 4. In the $Al_2O_3$ film 25, aluminum atoms and oxygen atoms exist at its uppermost surface. Thus, it is necessary to prevent aluminum atoms from being exposed at the uppermost surface. The $Al_2O_3$ film 25 is grown by vapor phase deposition such as the ALD method or the aforementioned MOCVD or PECVD method. At the end of this growth, the supply of the aluminum raw material is stopped, and only the oxygen raw material is supplied. Thus, an oxygen atom layer is formed as the last layer at the surface of the $Al_2O_3$ film 25. The semiconductor device 300 according to this embodiment is similar to the semiconductor device 200 according to the second embodiment, and different from the semiconductor device 101 of the comparative example, in that the uppermost surface of the $Al_2O_3$ film 25 constituting the gate insulating film 7 is formed from an oxygen atom layer. Except the above point, the semiconductor device 300 according to this embodiment has the same structure as the semiconductor device 200 according to the second embodiment, and the manufacturing method is similar. Hence, the description of the manufacturing method is omitted.

Thus, also in the semiconductor device 300 according to this embodiment, the gate insulating film 7 is composed of the oxide film 25 and the protective layer. The oxide film 25 is an $Al_2O_3$ film 25 covering the side surface of the p-type base layer 3 exposed at the sidewall of the trench, which penetrates through the p-type base layer 3 to the inside of the n⁻-type drift layer 2. The protective layer is made of an oxygen atom layer formed on this oxide film and opposed to the p-type base layer 3 in the trench. In direct contact with this gate insulating film 7, the gate electrode 8 of n-type polysilicon is buried in the trench 4 and opposed to the p-type base layer 3. That is, on the sidewall of the trench 4, the n-type polysilicon gate electrode is opposed to the p-type base layer 3 without direct contact with the $Al_2O_3$ film because of the protective layer made of the oxygen atom layer. Hence, because of the oxygen atom layer, the silicon atom of the gate electrode 8 is not directly coupled to the aluminum atom of the $Al_2O_3$ film. Accordingly, the oxygen atom layer prevents substitution of silicon and aluminum atoms between the $Al_2O_3$ film 25 and the n-type polysilicon gate electrode 8. Thus, when the n-type polysilicon gate electrode 8 is etched by CDE, increase in the etching rate of polysilicon by CDE occurring in the comparative example of FIG. 3 is suppressed at the interface between the n-type polysilicon gate electrode 8 and the gate insulating film 7. Hence, even if the $Al_2O_3$ film 25 with high dielectric constant is used for the gate insulating film of the trench gate structure, the semiconductor device 300 according to this embodiment has a flat polysilicon gate electrode and achieves good operating characteristics with low on-resistance as compared with the semiconductor device 101 of the comparative example.

In the semiconductor device 300 according to this embodiment, the gate insulating film 7 is composed of the oxide film 25 and the protective layer. The oxide film 25 is an $Al_2O_3$ film covering the side surface of the p-type base layer 3 exposed at the sidewall of the trench, which penetrates through the p-type base layer 3 to the inside of the n⁻-type drift layer 2.

The protective layer is made of an oxygen atom layer formed on this oxide film 25 and opposed to the p-type base layer 3 in the trench. As described in the second embodiment, the oxygen atom layer of this protective layer may be replaced by a nitrogen atom layer. Such a structure also achieves the same effect as the semiconductor device 300 according to this embodiment. For instance, at the end of the crystal growth by e.g. the MOCVD or PECVD method, after forming the aluminum atom layer, the supply of an oxygen raw material such as water ($H_2O$) can be replaced by the supply of a nitrogen raw material such as ammonia ($NH_3$). Thus, the last atom layer can be formed from a nitrogen atom layer.

Furthermore, as described in the first embodiment, the oxide film is not limited to $Al_2O_3$. Oxide films containing aluminum or yttrium also achieve the aforementioned effect of this embodiment. That is, as in the first embodiment, the oxide film is not limited to $Al_2O_3$, but $Y_2O_3$ (yttria), $HfY_xO_y$, (mixture of hafnia and yttria), and $HfAl_xO_y$ (hafnium aluminate), for instance, can also be used in this embodiment.

The embodiments of the invention have been described above. It has been assumed in this description that the first conductivity type and the second conductivity type are n-type and p-type, respectively. However, these conductivity types can be interchanged. The semiconductor device has been described by taking a MOSFET as an example. However, the invention is applicable to any semiconductor device having a structure in which n-type polysilicon is buried in a trench in contact with a metal oxide film. In particular, in the structure of each of the above embodiments, a p-type collector layer can be interposed between the $n^+$-type drain layer and the drain electrode. Thus, the above embodiments are applicable to an IGBT (Insulated Gate Bipolar Transistor) of the trench gate type. Furthermore, the method for forming the oxide film and the protective layer in the gate insulating film is not limited to the film forming method taken as an example in the above embodiments. Other film forming methods are also applicable without departing from the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer of a first conductivity type;
a first semiconductor layer of the first conductivity type provided on a first surface of the semiconductor layer of the first conductivity type;
a second semiconductor layer of a second conductivity type provided on the first semiconductor layer;
a trench provided from the second semiconductor layer to the first semiconductor layer;
a gate insulating film composed of an oxide film and a protective layer, the oxide film covering the second semiconductor layer exposed at a sidewall of the trench and including at least one of aluminum and yttrium, and the protective layer being formed on the oxide film;
a gate electrode made of n-type polysilicon buried in the trench in direct contact with the gate insulating film and opposed to the second semiconductor layer across the oxide film and the protective layer;
an interlayer insulating film provided on the gate electrode;
a third semiconductor layer of the first conductivity type selectively formed on a surface of the second semiconductor layer, and in contact with the gate insulating film at the sidewall of the trench;
a first electrode electrically connected to a second surface of the semiconductor layer on an opposite side of the first surface; and
a second electrode electrically connected to the third semiconductor layer, wherein the protective layer includes one of a silicon oxide film, a silicon nitride film, and a silicon oxynitride film.

2. A semiconductor device comprising:
a semiconductor layer of a first conductivity type;
a first semiconductor layer of the first conductivity type provided on a first surface of the semiconductor layer of the first conductivity type;
a second semiconductor layer of a second conductivity type provided on the first semiconductor layer;
a trench provided from the second semiconductor layer to the first semiconductor layer;
a gate insulating film composed of an oxide film and a protective layer, the oxide film covering the second semiconductor layer exposed at a sidewall of the trench and including at least one of aluminum and yttrium, and the protective layer being formed on the oxide film;
a gate electrode made of n-type polysilicon buried in the trench in direct contact with the gate insulating film and opposed to the second semiconductor layer across the oxide film and the protective layer;
an interlayer insulating film provided on the gate electrode;
a third semiconductor layer of the first conductivity type selectively formed on a surface of the second semiconductor layer, and in contact with the gate insulating film at the sidewall of the trench;
a first electrode electrically connected to a second surface of the semiconductor layer on opposite side of the first surface; and
a second electrode electrically connected to the third semiconductor layer, wherein the protective layer is an oxygen atom layer covering a surface of the oxide film on the gate electrode side.

3. A semiconductor device comprising:
a semiconductor layer of a first conductivity type;
a first semiconductor layer of the first conductivity type provided on a first surface of the semiconductor layer of the first conductivity type;
a second semiconductor layer of a second conductivity type provided on the first semiconductor layer;
a trench provided from the second semiconductor layer to the first semiconductor layer;
a gate insulating film composed of an oxide film and a protective layer, the oxide film covering the second semiconductor layer exposed at a sidewall of the trench and including at least one of aluminum and yttrium, and the protective layer being formed on the oxide film;
a gate electrode made of n-type polysilicon buried in the trench in direct contact with the gate insulating film and opposed to the second semiconductor layer across the oxide film and the protective layer;
an interlayer insulating film provided on the gate electrode;
a third semiconductor layer of the first conductivity type selectively formed on a surface of the second semiconductor layer, and in contact with the gate insulating film at the sidewall of the trench;

a first electrode electrically connected to a second surface of the semiconductor layer on opposite side of the first surface; and a second electrode electrically connected to the third semiconductor layer, wherein the protective layer is an nitrogen atom layer covering a surface of the oxide film on the gate electrode side.

4. The device according to claim 1, wherein the oxide film is $Al_2O_3$.

5. The device according to claim 1, wherein the oxide film is one of $HfAl_xO_y$, $Y_2O_3$, and $HfY_xO_y$.

6. The device according to claim 2, wherein the oxide film includes a single crystal with a C-axis oriented in a direction perpendicular to the surface of the second semiconductor layer exposed at the sidewall of the trench.

7. The device according to claim 3, wherein the oxide film includes a single crystal with a C-axis oriented in a direction perpendicular to the surface of the second semiconductor layer exposed at the sidewall of the trench.

8. The device according to claim 4, wherein the oxide film includes a single crystal with a C-axis oriented in a direction perpendicular to the surface of the second semiconductor layer exposed at the sidewall of the trench.

9. A method for manufacturing a semiconductor device, comprising:

forming, on a first surface of a semiconductor layer of a first conductivity type, a first semiconductor layer of the first conductivity type having a lower first conductivity type impurity concentration than the semiconductor layer of the first conductivity type;

forming a second semiconductor layer of a second conductivity type on the first semiconductor layer;

forming a trench penetrating through the second semiconductor layer to inside of the first semiconductor layer;

forming a gate insulating film by forming an oxide film and then forming a protective layer, the oxide film covering the second semiconductor layer exposed at a sidewall of the trench and including at least one of aluminum and yttrium, and the protective layer being made of an oxygen atom layer or a nitrogen atom layer covering a surface of the oxide film;

forming a gate electrode made of n-type polysilicon buried in the trench in direct contact with the gate insulating film and opposed to the second semiconductor layer across the oxide film and the protective layer;

forming an interlayer insulating film on the gate electrode so as to insulate the gate electrode from outside of the trench;

selectively forming a third semiconductor layer of the first conductivity type in a surface of the second semiconductor layer so as to be in contact with the gate insulating film at the sidewall of the trench;

forming a first electrode so as to be electrically connected to a second surface of the semiconductor layer on opposite side of the first surface; and forming a second electrode so as to be electrically connected to the third semiconductor layer and the second semiconductor layer.

10. The method according to claim 9, wherein in the forming a gate insulating film, the protective layer made of the oxygen atom layer covering the surface of the oxide film is formed by stopping supply of a raw material of aluminum or yttrium and supplying an oxygen raw material to the surface of the oxide film.

11. The method according to claim 9, wherein in the forming a gate insulating film, the protective layer made of the nitrogen atom layer covering the surface of the oxide film is formed by stopping supply of a raw material of aluminum or yttrium and supplying an nitrogen raw material to the surface of the oxide film.

12. The method according to claim 9, wherein the oxide film including at least one of aluminum and yttrium is $Al_2O_3$.

13. The method according to claim 9, wherein the oxide film including at least one of aluminum and yttrium is one of $HfAl_xO_y$, $Y_2O_3$, and $HfY_xO_y$.

14. The method according to claim 10, wherein the oxide film is formed by crystal growth so that a C-axis is oriented in a direction perpendicular to the surface of the second semiconductor layer exposed at the sidewall of the trench.

15. The method according to claim 11, wherein the oxide film is formed by crystal growth so that a C-axis is oriented in a direction perpendicular to the surface of the second semiconductor layer exposed at the sidewall of the trench.

16. The method according to claim 12, wherein the oxide film is formed by crystal growth so that a C-axis is oriented in a direction perpendicular to the surface of the second semiconductor layer exposed at the sidewall of the trench.

17. The method according to claim 10, wherein the oxide film is formed by ALD.

18. The method according to claim 11, wherein the oxide film is formed by ALD.

* * * * *